(12) United States Patent
Kim

(10) Patent No.: US 10,345,939 B2
(45) Date of Patent: Jul. 9, 2019

(54) DISPLAY PANEL WITH TOUCH-SENSING FUNCTION AND DISPLAY DEVICE INCLUDING THE SAME

(71) Applicant: SAMSUNG DISPLAY CO., LTD., Yongin-si, Gyeonggi-do (KR)

(72) Inventor: Yun-ho Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/635,788

(22) Filed: Jun. 28, 2017

(65) Prior Publication Data

US 2018/0004330 A1 Jan. 4, 2018

(30) Foreign Application Priority Data

Jun. 29, 2016 (KR) .................. 10-2016-0081715

(51) Int. Cl.
*G06F 3/041* (2006.01)
*H01L 27/32* (2006.01)
*H01L 51/00* (2006.01)
*H01L 51/52* (2006.01)

(52) U.S. Cl.
CPC .......... *G06F 3/0412* (2013.01); *H01L 27/323* (2013.01); *H01L 27/3255* (2013.01); *H01L 27/3276* (2013.01); *H01L 51/0097* (2013.01); *H01L 51/5246* (2013.01); *H01L 51/5281* (2013.01); *H01L 2251/5338* (2013.01)

(58) Field of Classification Search
CPC ................... G06F 3/0412; G06F 3/044; G06F 2203/04103; G06F 1/1643; G06F 3/0416
See application file for complete search history.

(56) References Cited

U.S. PATENT DOCUMENTS

| 6,281,592 B1 * | 8/2001 | Murayama ............ H01L 21/563 257/691 |
| 2006/0160259 A1 * | 7/2006 | Chiang ................... G02F 1/1339 438/26 |
| 2009/0185339 A1 * | 7/2009 | Kwon ..................... G02F 1/1333 361/679.21 |

(Continued)

FOREIGN PATENT DOCUMENTS

| KR | 10-2007-0106603 A | 11/2007 |
| KR | 10-2010-0088884 A | 8/2010 |

(Continued)

*Primary Examiner* — Dong Hui Liang

(74) *Attorney, Agent, or Firm* — Lee & Morse, P.C.

(57) ABSTRACT

A display panel includes a display substrate including a display region and a non-display region surrounding the display region, a pad unit being positioned on a side region of the non-display region, and a touch substrate on the display substrate and bonded to the display substrate, the touch substrate including an input sensing unit overlapping the display region of the display substrate, a first extended portion extending from a side portion of the input sensing unit and overlapping the pad unit of the display substrate, and a second extended portion extending from a side portion of the input sensing unit and overlapping the pad unit of the display substrate, the second extended portion being spaced apart from the first extended portion, wherein a portion of the pad unit is exposed between the first and second extended portions.

20 Claims, 17 Drawing Sheets

(56) References Cited

U.S. PATENT DOCUMENTS

| | | | |
|---|---|---|---|
| 2011/0050682 A1 | 3/2011 | Lin et al. | |
| 2012/0127092 A1* | 5/2012 | Lee | G06F 3/044 345/173 |
| 2012/0319967 A1* | 12/2012 | Tsai | G06F 1/1626 345/173 |
| 2013/0044282 A1* | 2/2013 | Kuwabara | G02F 1/1333 349/96 |
| 2014/0210738 A1* | 7/2014 | Hur | G06F 3/0412 345/173 |
| 2016/0088732 A1* | 3/2016 | Nakano | G06F 3/0412 174/251 |
| 2016/0313834 A1* | 10/2016 | Ma | H01L 27/323 |

FOREIGN PATENT DOCUMENTS

| | | |
|---|---|---|
| KR | 10-2011-0080580 A | 7/2011 |
| KR | 10-2013-0078143 A | 7/2013 |
| KR | 10-2015-0079265 A | 7/2015 |

\* cited by examiner

DISPLAY PANEL WITH TOUCH-SENSING FUNCTION AND DISPLAY DEVICE INCLUDING THE SAME

CROSS-REFERENCE TO RELATED APPLICATION

Korean Patent Application No. 10-2016-0081715, filed on Jun. 29, 2016, in the Korean Intellectual Property Office, and entitled: "Display Panel with Touch-Sensing Function and Display Device Including the Same," is incorporated by reference herein in its entirety.

BACKGROUND

1. Field

The present disclosure relates to a display panel with a touch-sensing function and a display device including the same, and in particular, to a touch-sensible display panel with improved durability and a display device including the same.

2. Description of the Related Art

With the advent of an information-oriented society, there is an increasing demand for display devices (e.g., electronic devices including mobile communication terminals, digital cameras, notebooks, monitors, TVs, and so forth), which are configured to display an image. For example, a touch screen panel (TSP), which is configured to receive information on a touch event and display an image corresponding to the touch information, may be used for the display device. In the case that a display device has a touch-sensing function, an input device such as a keyboard, a mouse, or a keypad is not needed, and thus, it is possible to improve the user's convenience.

The TSP includes a display substrate for displaying an image and a touch substrate for performing a touch-sensing function. In general, the display and touch substrates are coupled to each other. The touch substrate may be manufactured to further have an encapsulation function of protecting the display substrate.

SUMMARY

According to some embodiments, a display panel may include a display substrate, which includes a display region and a non-display region surrounding the display region and includes a pad unit provided on a side region of the non-display region and a touch substrate, which is provided on the display substrate and is bonded to the display substrate. The touch substrate may include an input sensing unit overlapped with the display region of the display substrate, a first extended portion overlapped with the pad unit of the display substrate and connected to a side portion of the input sensing unit, and a second extended portion overlapped with the pad unit of the display substrate, connected to the side portion of the input sensing unit, and spaced apart from the first extended portion. A portion of the pad unit may be exposed between the first and second extended portions.

In some embodiments, the touch substrate may further include a third extended portion provided between the first and second extended portions and spaced apart from the input sensing unit. The input sensing unit, the first extended portion, the second extended portion, and the third extended portion may be provided to define a hole in a side region of the touch substrate. The hole may be provided to expose a portion of the pad unit.

In some embodiments, the first extended portion, the second extended portion, and the input sensing unit may be provided to define a groove in a side region of the touch substrate.

In some embodiments, an inner surface of the groove may include a first surface defined as one of inner side surfaces of the first extended portion, a second surface defined as one of inner side surfaces of the second extended portion, the second surface facing the first surface, and a third surface defined as one of inner side surfaces of the input sensing unit, the third surface connecting the first and second surfaces to each other.

In some embodiments, an inner surface of the groove may include a curved surface.

In some embodiments, a distance between the first and second surfaces may increase with increasing distance from the third surface.

In some embodiments, the inner surface of the groove may further include a fourth surface provided between the first and third surfaces to connect the first and third surfaces to each other and having an obtuse angle relative to each of the first and third surfaces and a fifth surface provided between the second and third surfaces to connect the second and third surfaces to each other. The fifth surface may have an obtuse angle relative to each of the second and third surfaces.

In some embodiments, a portion of the display substrate overlapped with the pad unit may have a width decreasing with increasing distance from the display region.

In some embodiments, the display panel may further include a sealing element provided on the touch substrate overlapped with the non-display region and used to couple the display and touch substrates to each other. The sealing element may include a first sealing element overlapped with an edge region of the input sensing unit, a second sealing element overlapped with the first extended portion, and a third sealing element overlapped with the second extended portion.

In some embodiments, the sealing element may include glass powder.

In some embodiments, the second sealing element may be overlapped with an edge region of the first extended portion, and the third sealing element may be overlapped with an edge region of the second extended portion.

In some embodiments, each of the second and third sealing elements may be provided to form a patterned structure.

In some embodiments, the display panel may further include a driving integrated circuit provided on the portion of the pad unit exposed between the first and second extended portions.

According to some embodiments, a display panel may include a display substrate, which includes a display region and a non-display region surrounding the display region and includes a pad unit provided on a side region of the non-display region, and a touch substrate, which is provided on the display substrate and is bonded to the display substrate. The touch substrate may be provided to have a groove in a side region thereof overlapped with the pad unit, and a portion of the pad unit may be exposed through the groove.

According to some embodiments, a display device may include a window part, a display panel configured to display an image, a polarizing plate provided between the window part and the display panel. The display panel may include a display substrate, which includes a display region and a non-display region surrounding the display region and includes a pad unit provided on a side region of the non-display region, and a touch substrate, which is provided on the display substrate and is bonded to the display substrate. The touch substrate may include an input sensing unit overlapped with the display region of the display substrate, a first extended portion overlapped with the pad unit of the display substrate and connected to a side portion of the input sensing unit, and a second extended portion overlapped with the pad unit of the display substrate, connected to the side portion of the input sensing unit, and spaced apart from the first extended portion. A portion of the pad unit may be exposed between the first and second extended portions.

In some embodiments, the display device may further include a printed circuit board provided below the display panel and electrically connected to the display panel.

In some embodiments, the display device may further include a first flexible circuit board electrically connecting the display substrate to the printed circuit board, and a second flexible circuit board electrically connecting the touch substrate to the printed circuit board.

In some embodiments, the display panel may further include a first bonding part provided on the pad unit and connected to the first flexible circuit board, a second bonding part provided in at least one of the first or second extended portion to be connected to the second flexible circuit board.

In some embodiments, the display device may further include a driving integrated circuit provided on the portion of the pad unit exposed between the first and second extended portions.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
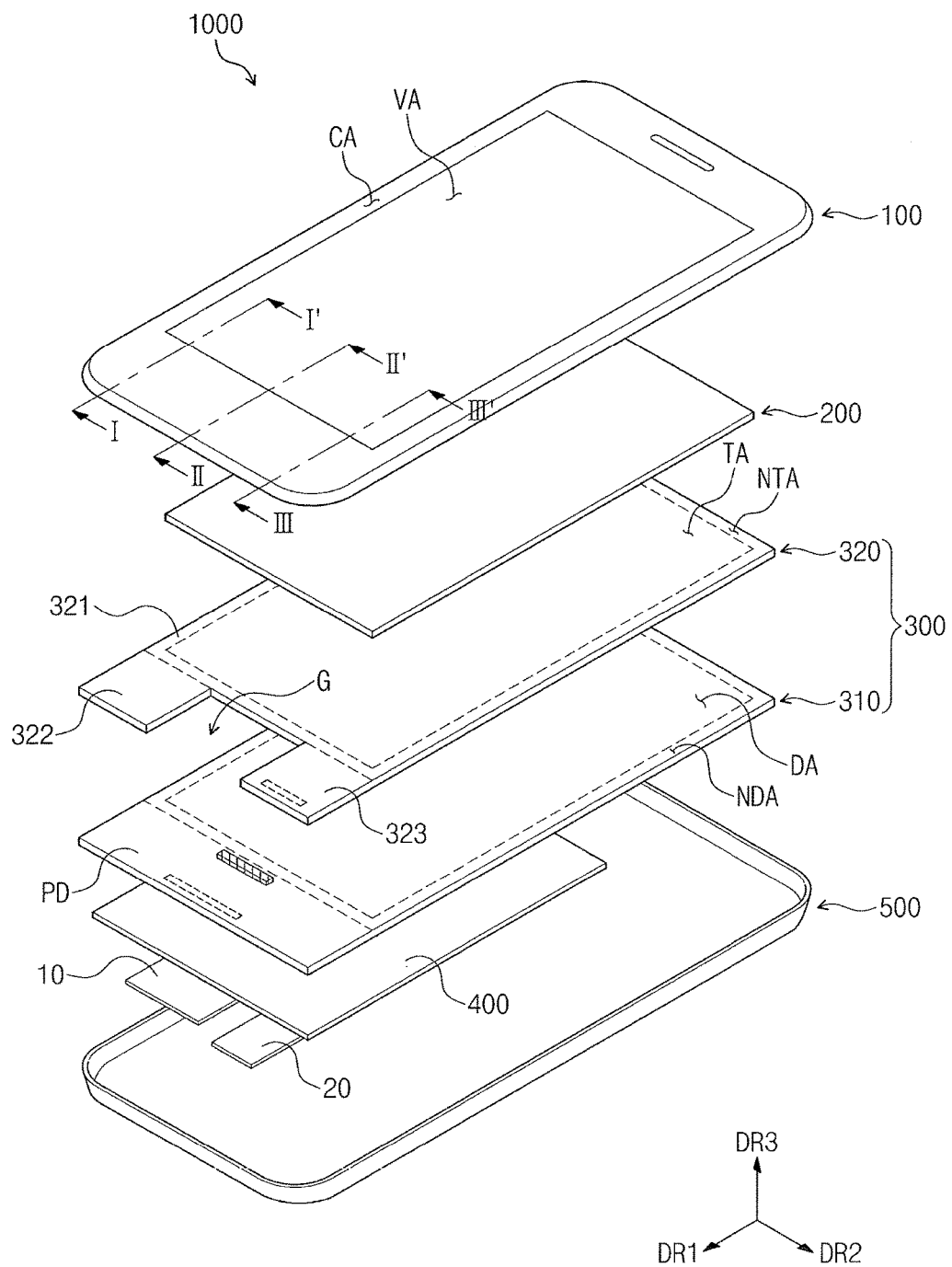
FIG. 1 illustrates an exploded perspective view of a display device according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. It will further be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "adjacent" versus "directly adjacent"). Like reference numerals refer to like elements throughout It should further be noted that the figures are intended to illustrate the general characteristics of methods, structure and/or materials utilized in certain example embodiments and to supplement the written description provided below. Therefore, the drawings should not be interpreted as defining or limiting the range of values or properties encompassed by example embodiments.

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, e.g., of manufacturing techniques and/or tolerances, are to be expected. Thus, example embodiments should not be construed as limited to the particular shapes of regions illustrated herein but are to include deviations in shapes, e.g., that result from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an exploded perspective view illustrating a display device according to some embodiments.

Referring to FIG. 1, a display device 1000 according to some embodiments may have a, e.g., rectangular, shape whose long and short sides are parallel to first and second directions DR1 and DR2, respectively. However, embodiments are not limited to this example, e.g., the shape of the display device 1000 may be variously changed. The display device 1000 may include a window part 100, a polarizing plate 200, a display panel 300, and a storage element 500.

The window part 100 may include a light-transmitting portion VA, which allows an image produced by the display panel 300 to pass therethrough, and a light-blocking portion CA, which is disposed adjacent to the light-transmitting portion VA and prevents the image from passing therethrough. In some embodiments, the light-transmitting portion VA may be provided to be overlapped with a center of the display device 1000, when viewed in a plan view. The light-blocking portion CA may be provided at a peripheral region of the light-transmitting portion VA to, e.g., completely, surround, e.g., a perimeter of, the light-transmitting portion VA. For example, the light-blocking portion CA may have a frame-like shape.

However, embodiments are not limited to this example, e.g., the window part 100 of the display device 1000 may be configured to have only the light-transmitting portion VA. In other words, the light-blocking portion CA may be omitted. In this case, an image can be displayed on the entire top surface of the window part 100.

The window part 100 may be formed of or include at least one of, e.g., glass, sapphire, or plastic.

The polarizing plate 200 may be provided below the window part 100. The polarizing plate 200 may be configured to prevent or suppress external light from being reflected thereby, and may be used to change a polarization state of light emitted from the display panel 300. In certain embodiments, the polarizing plate 200 may be omitted.

Figure 4:
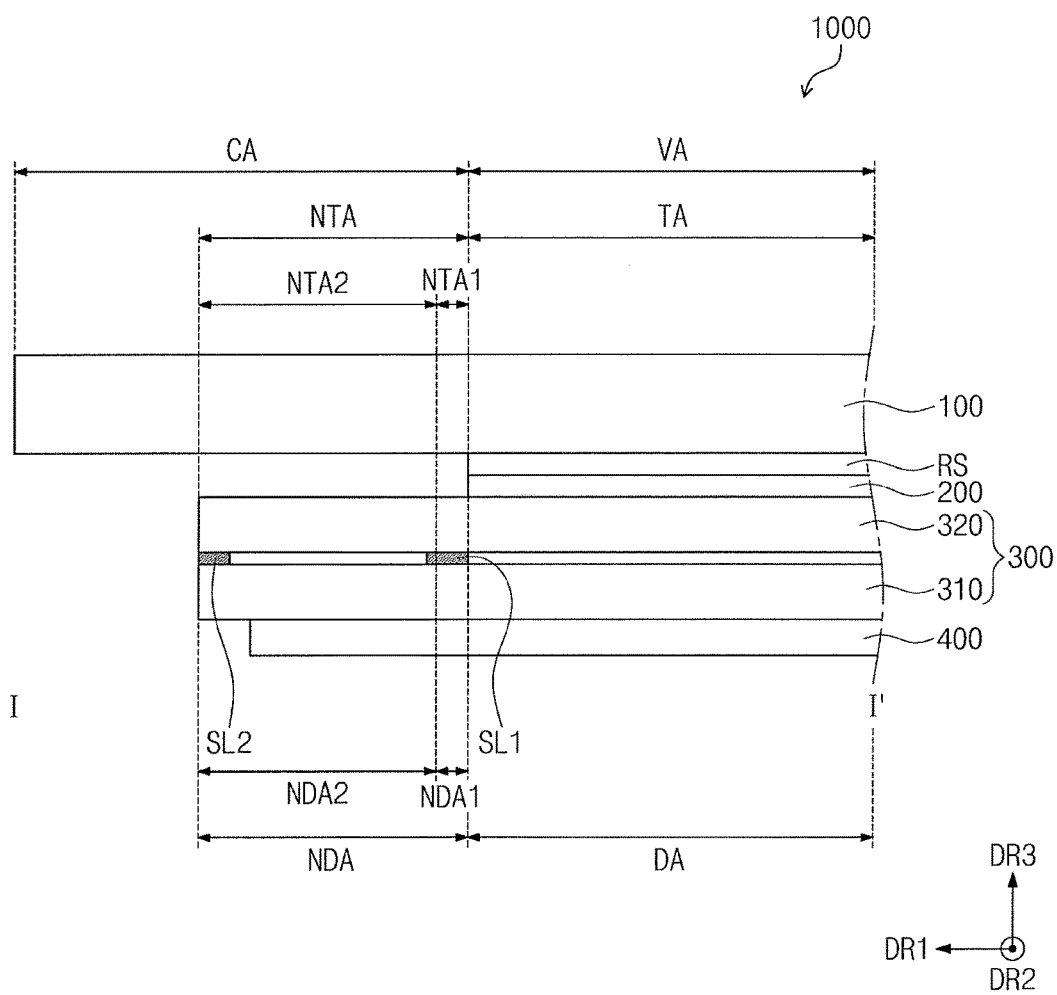
FIG. 4 illustrates a sectional view of the display device of FIG. 1, taken along line I-I' of FIG. 1.
Figure 5:
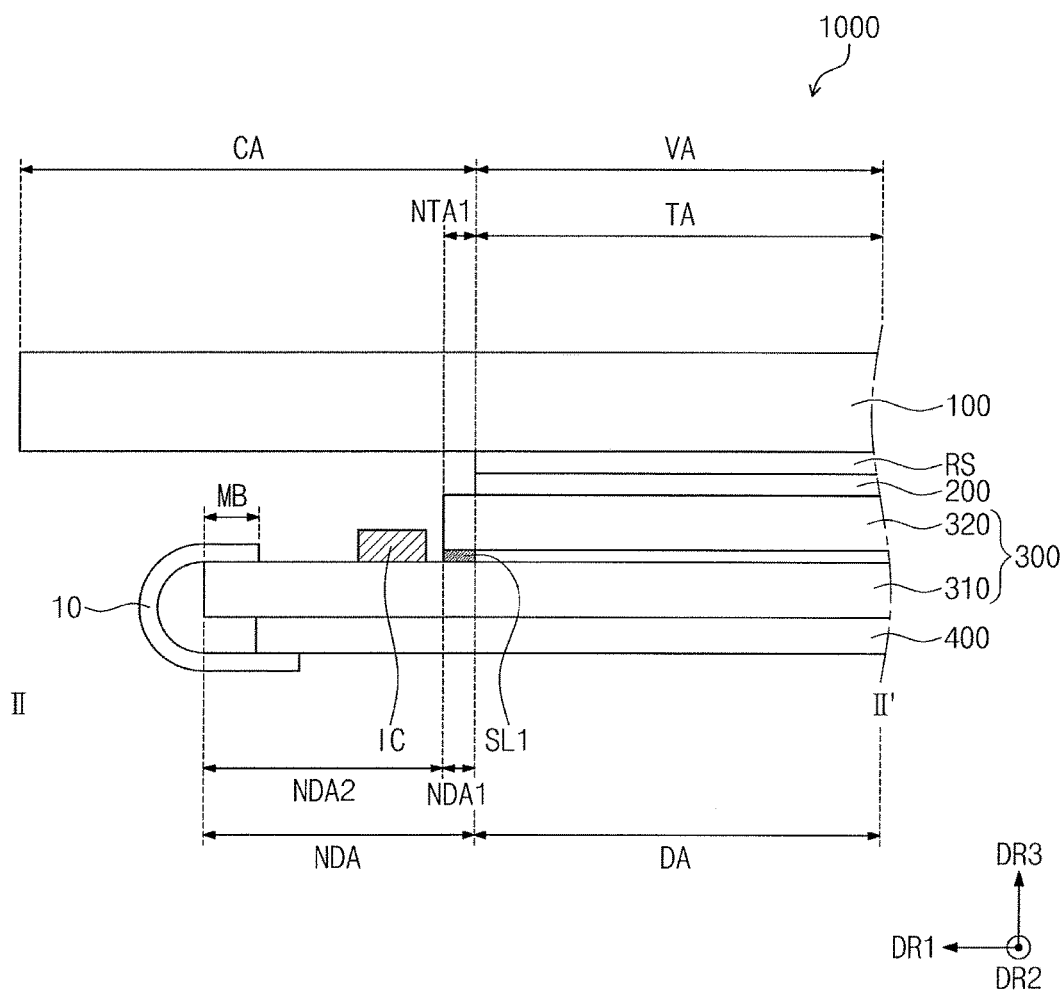
FIG. 5 illustrates a sectional view of the display device of FIG. 1, taken along line II-II' of FIG. 1.
Figure 6:
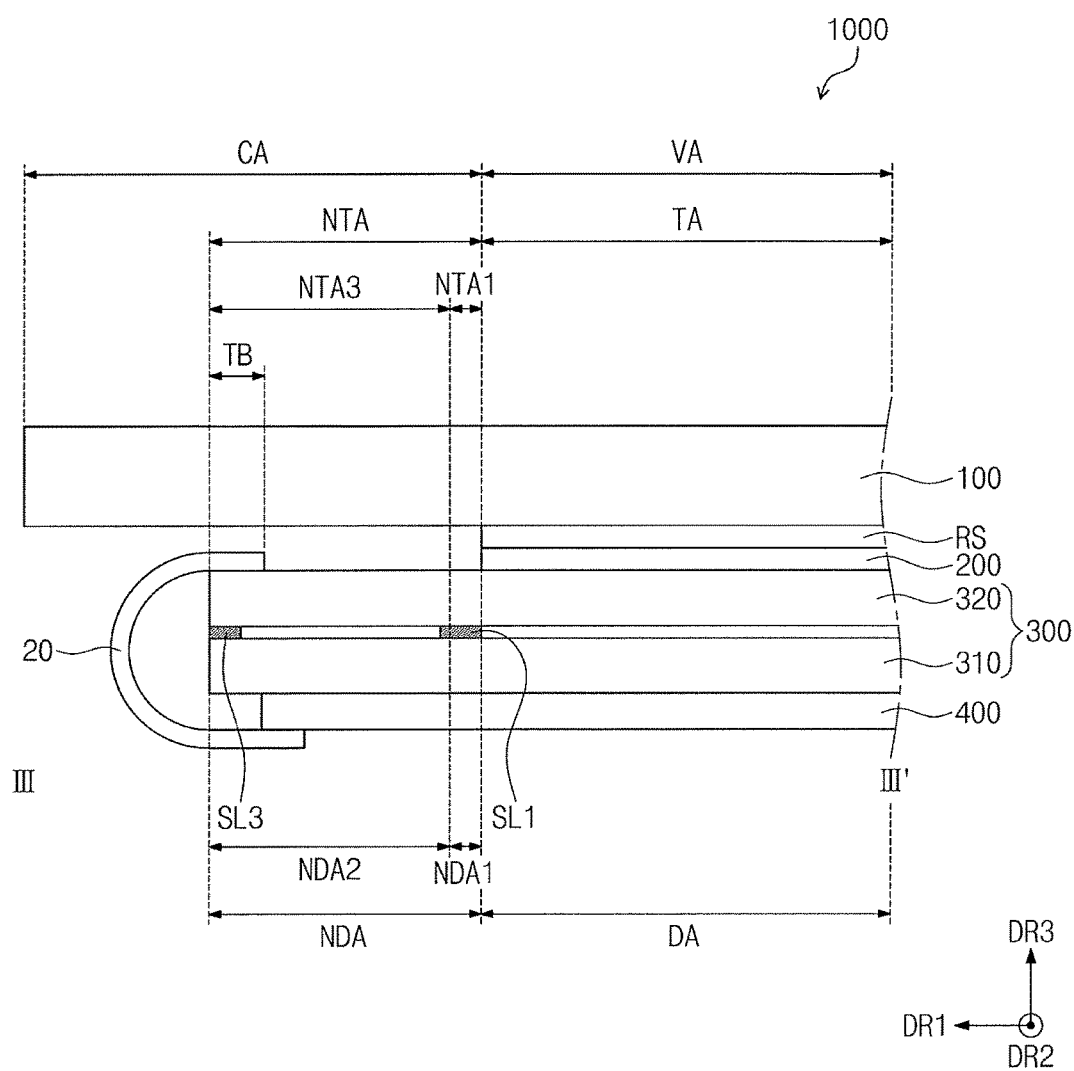
FIG. 6 illustrates a sectional view of the display device of FIG. 1, taken along line III-III' of FIG. 1.

The polarizing plate 200 may be coupled to the window part 100 by an adhesive element RS (e.g., see FIGS. 4 to 6). The adhesive element RS may include a polymer resin. As an example, the adhesive element RS may be formed of or include at least one of, e.g., photo-curable resins or thermo-curable resins.

The display panel 300 may be provided below the polarizing plate 200, e.g., the polarizing plate 200 may be between the display panel 300 and the window part 100. The display panel 300 may be configured to sense a touch event. As an example, the display panel 300 may include a display substrate 310 and a touch substrate 320. The display panel 300 may have a laminated structure, in which the display and touch substrates 310 and 320 are bonded to each other.

The display substrate 310 may be used as a base structure, allowing the touch substrate 320 to be disposed thereon, e.g., the touch substrate 320 may be positioned between the display substrate 310 and the polarizing plate 200. As an example, the display substrate 310 may be a single insulating substrate or a single insulating film.

The display substrate 310 may include a display region DA and a non-display region NDA surrounding the display region DA. The display region DA may be overlapped with the light-transmitting portion VA of the window part 100, and the non-display region NDA may be overlapped with the light-blocking portion CA of the window part 100.

The display substrate 310 may be configured to display an image on the display region DA. The display substrate 310 may include a plurality of pixels. In the case where an electrical signal is applied to each of the pixels, each of the pixels may be configured to emit light corresponding to the electrical signal.

A type of the display panel 300 may be changed depending on a type of the display substrate 310 (for example, depending on configuration of the pixels of the display substrate 310). As an example, the display panel 300 may be an organic light emitting display panel. However, embodiments are not limited to a specific type of the display panel 300, and various other types of display panels may be used to realize embodiments. For example, the display panel 300 may be one of a liquid crystal display panel, an electrophoresis display panel, an electrowetting display panel, or various other display panels configured to display an image thereon.

The touch substrate 320 may be provided between the display substrate 310 and the polarizing plate 200. The touch substrate 320 may be used as an encapsulation substrate encapsulating the display substrate 310.

The touch substrate 320 may include an active region TA and an inactive region NTA surrounding, e.g., an entire perimeter of, the active region TA. The active region TA may be overlapped with the display region DA of the display substrate 310, and the inactive region NTA may be overlapped with the non-display region NDA of the display substrate 310. In other words, the active region TA of the touch substrate 320 may be overlapped with the light-transmitting portion VA of the window part 100, and the inactive region NTA of the touch substrate 320 may be overlapped with the light-blocking portion CA of the window part 100. However, embodiments are not limited to this example. For example, in certain embodiments, the active region TA may be overlapped with both of the light-transmitting portion VA and the light-blocking portion CA of the window part 100.

The touch substrate 320 may sense an external touch signal to be provided to the active region TA. The touch substrate 320 may include a touch cell, in which touch electrodes sensing an external touch signal are provided, and driving interconnection lines, which are used to apply an electrical signal to the touch cell or to transmit an electrical signal generated in the touch cell to the outside.

A touch signal may be provided in various manners to the touch substrate 320. As an example, a touch signal may be provided to the touch substrate 320 through a part of a user's body (e.g., a finger). However, embodiments are not limited to a specific way of providing a touch signal, e.g., a touch signal may be input using one of optical, contact-sensitive, or magnetic manners.

The touch substrate 320 may sense a touch signal in various manners. As an example, the touch substrate 320 may be configured to operate in one of resistive-layer, electrostatic-capacitance, and electromagnetic-induction manners and may be used to obtain information on coordinates of a position at which a touch event occurs.

According to some embodiments, the display device 1000 may further include a printed circuit board 400. The printed circuit board 400 may be provided below the display panel 300.

Furthermore, the display device 1000 may further include first and second flexible circuit boards 10 and 20. The printed circuit board 400 may be electrically connected to the display panel 300 through the first and second flexible circuit boards 10 and 20. The printed circuit board 400 may be configured to provide an electrical signal to the display substrate 310 and to receive a touch signal to be sensed through the touch substrate 320.

The storage element 500 may be provided at the lowermost level of the display device 1000 and may be coupled to the window part 100. The storage element 500 may be used to contain the polarizing plate 200, the display panel 300, and the printed circuit board 400. The storage element 500 may be formed of or include a plastic or a metal. In certain embodiments, the storage element 500 may be omitted.

Hereinafter, the display panel 300 will be described in more detail with reference to the accompanying drawings.

Figure 2:
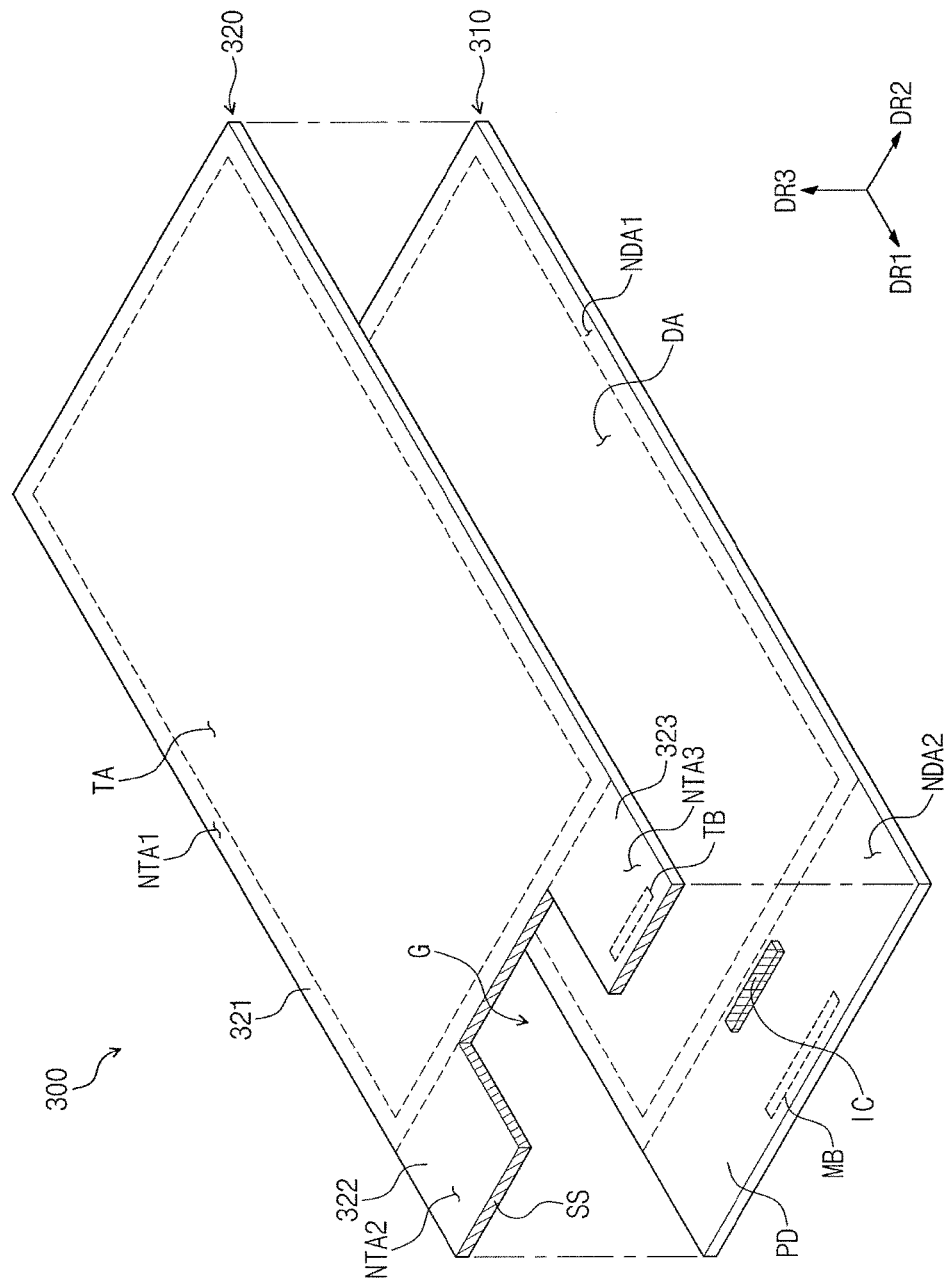
FIG. 2 illustrates an exploded perspective view of the display panel of FIG. 1.
Figure 3:
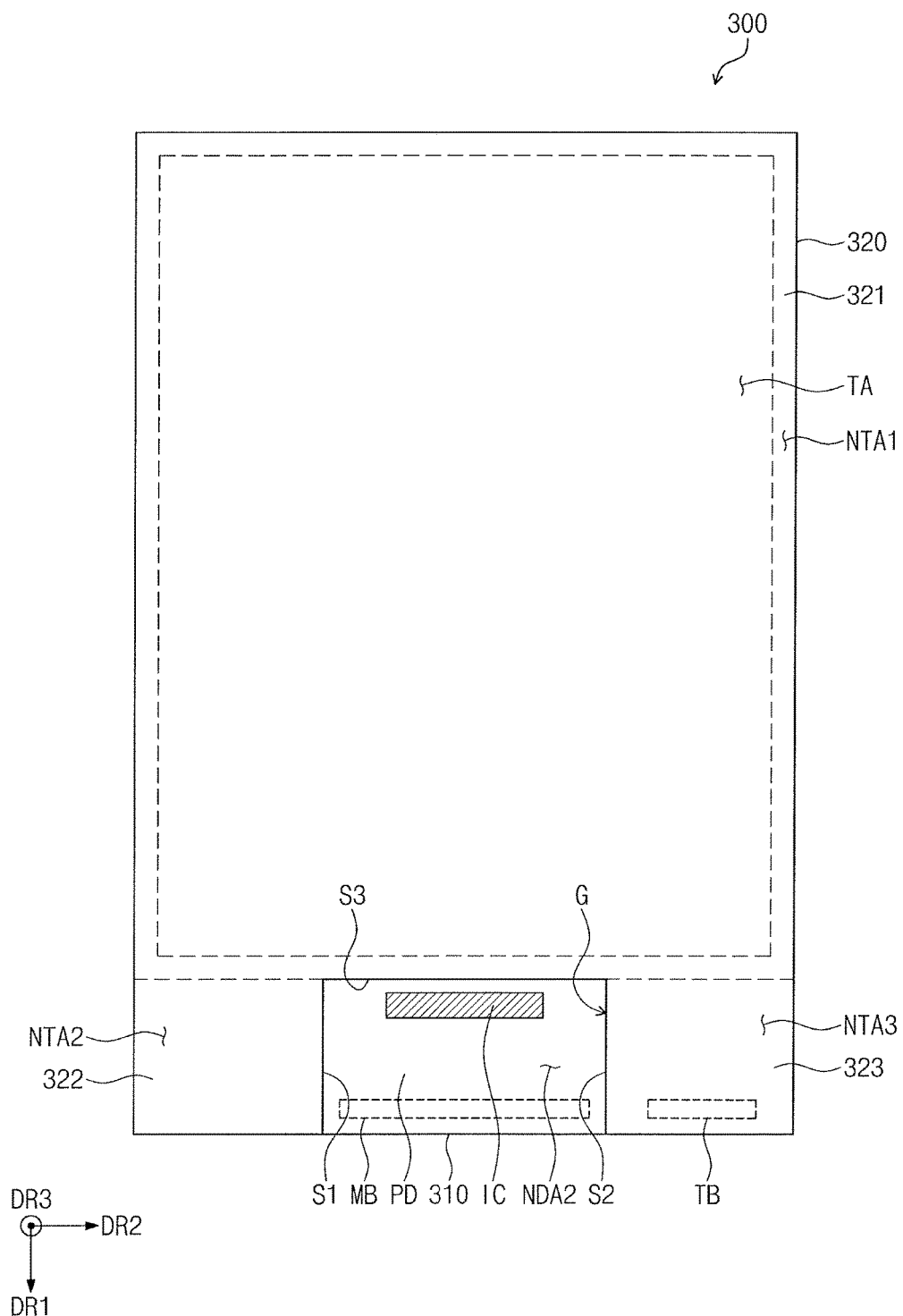
FIG. 3 illustrates a top-side view of the display panel of FIG. 1.

FIG. 2 is an exploded perspective view of the display panel 300, and FIG. 3 is a top-side view of the display panel 300.

Referring further to FIGS. 2 and 3, the display substrate 310 may include the display region DA, which is overlapped with a center of the display substrate 310 when viewed in a plan view. Each of the pixels on the display region DA may include an organic light emitting device containing a luminescent material, transistors operating the organic light emitting device, and so forth. The organic light emitting device may be configured to emit light whose color is one of red, green, blue, and white, but embodiments are not limited thereto.

The non-display region NDA may include a first non-display region NDA1 and a second non-display region NDA2. The first non-display region NDA1 may surround, e.g., an entire perimeter of, the display region DA, e.g., to have a frame-like shape. The second non-display region NDA2 may be defined in a side region of the display substrate 310 in the first direction DR1, e.g., the second non-display region NDA2 may be adjacent to the display substrate 310 along the first direction DR1.

A pad unit PD may be provided on the second non-display region NDA2. The pad unit PD may include a plurality of interconnection lines.

The display substrate 310 may further include at least one driving chip IC provided on the pad unit PD. The driving chip IC may be electrically connected to the pad unit PD through the interconnection lines. The driving chip IC may provide a data signal, which is used to display an image, to the display substrate 310. The driving chip IC may be provided on the pad unit PD by a chip-on-glass (COG) method.

The touch substrate 320 may be provided on the display substrate 310 to cover the display region DA of the display substrate 310. The touch substrate 320 may be provided to cover the pixels on the display substrate 310 and to prevent the air and moisture from infiltrating, e.g., permeating, into the pixels, thereby protecting the pixels from the air and moisture. The display and touch substrates 310 and 320 may be hermetically bonded to each other by a sealing element. The sealing element will be described in more detail with reference to FIGS. 4 to 7.

The active region TA defined in the touch substrate 320 may overlap a center of the touch substrate 320, when viewed in a plan view. A plurality of touch cells may be provided on the active region TA.

The inactive region NTA may include a first inactive region NTA1, a second inactive region NTA2, and a third inactive region NTA3. The first inactive region NTA1 may be provided to surround the active region TA or have a frame-like shape and may be overlapped with the display region DA of the display substrate 310.

The second and third inactive regions NTA2 and NTA3 may be defined in a side region of the touch substrate 320, e.g., adjacent to the touch substrate 320, in the first direction DR1, and may overlap a portion of the second non-display region NDA2 of the display substrate 310. The second and third inactive regions NTA2 and NTA3 may be spaced apart from each other in the second direction DR2. For example, the second inactive region NTA2 may be defined in a side region of the touch substrate 320 in the second direction DR2, and the third inactive region NTA3 may be defined in another side region of the touch substrate 320 in the second direction DR2. A plurality of interconnection lines may be provided on the second and third inactive regions NTA2 and NTA3 and may be electrically connected to touch cells.

The touch substrate 320 may include an input sensing unit 321, a first extended portion 322, and a second extended portion 323. The input sensing unit 321 may be provided on the active region TA and the first inactive region NTA1. The first extended portion 322 may be provided on the second inactive region NTA2. The second extended portion 323 may be provided on the third inactive region NTA3.

The first and second extended portions 322 and 323 may be connected to a side of the input sensing unit 321 in the first direction DR1. In other words, the first and second extended portions 322 and 323 may have a structure extending from the input sensing unit 321 in the first direction DR1.

The first extended portion 322 may be connected to a side of the input sensing unit 321 in the second direction DR2, e.g., the first extended portion 322 may extend along a part of a side of the input sensing unit 321 in the second direction DR2, and the second extended portion 323 may be connected to other side of the input sensing unit 321 in the second direction DR2, e.g., the second extended portion 323 may extend along a part of a side of the input sensing unit 321 in the second direction DR2. The first extended portion 322 may be spaced apart from the second extended portion 323 in the second direction DR2. In some embodiments, the first and second extended portions 322 and 323 may be provided to cover two portions of the pad unit PD which are spaced apart from each other in the second direction DR2.

A side surface SS of the touch substrate 320 parallel to the second direction DR2 may be provided to have a groove G. The groove G may have a recessed shape in a direction from the side surface SS toward the input sensing unit 321. For example, the groove G may separate the first and second extended portions 322 and 323 along the second direction DR2.

For example, in a side region of the touch substrate 320 in the first direction DR1, the groove G may be defined by the input sensing unit 321, the first extended portion 322, and the second extended portion 323. The groove G may be defined by an inner side surface of each of the input sensing unit 321, the first extended portion 322, and the second extended portion 323.

For example, the groove G may include a first surface S1, a second surface S2, and a third surface S3. The first surface S1 may be defined as one of inner side surfaces of the first extended portion 322. The second surface S2 may be defined as one of inner side surfaces of the second extended portion 323. The third surface S3 may be defined as one of inner side surfaces of the input sensing unit 321.

The first surface S1 may face the second surface S2. The first surface S1 may be parallel to the second surface S2. The third surface S3 may be positioned between the first and second extended portions 322 and 323 to connect the first surface S1 to the second surface S2. In some embodiments, angles between the first and third surfaces S1 and S3 and between the second and third surfaces S2 and S3 may be about 90 degrees.

The groove G of the touch substrate 320 may be formed to expose a portion of the pad unit PD of the display substrate 310. For example, the groove G may be provided to expose a center region of the pad unit PD in the second direction DR2. The driving chip IC may be provided on the exposed region of the pad unit PD.

FIG. 4 is a sectional view along line I-I' of FIG. 1, FIG. 5 is a sectional view along line II-II' of FIG. 1, and FIG. 6 is a sectional view along line III-III' of FIG. 1. For convenience, the storage element 500 is omitted in FIGS. 4 to 6.

Referring to FIGS. 2, 3, and 5, the pad unit PD of the display substrate 310 may include at least one bonding part. As an example, the pad unit PD may include a first bonding part MB, which is provided in a side region of the pad unit PD in the first direction DR1. The first flexible circuit board 10 may include two portions which are attached to the first bonding part MB and to the printed circuit board 400 to electrically connect the display substrate 310 to the printed circuit board 400. The first bonding part MB may be exposed by the groove G.

Referring to FIGS. 2, 3, and 6, the first or second extended portion 322 or 323 of the touch substrate 320 may include at least one bonding part. As an example, the second extended portion 323 may include a second bonding part TB (FIGS. 2-3), which is provided in a side region of the second extended portion 323 in the first direction DR1. As illustrated in FIG. 6, the second flexible circuit board 20 may include two portions which are attached to the second bonding part TB and to the printed circuit board 400 to electrically connect the touch substrate 320 to the printed circuit board 400.

Figure 7:
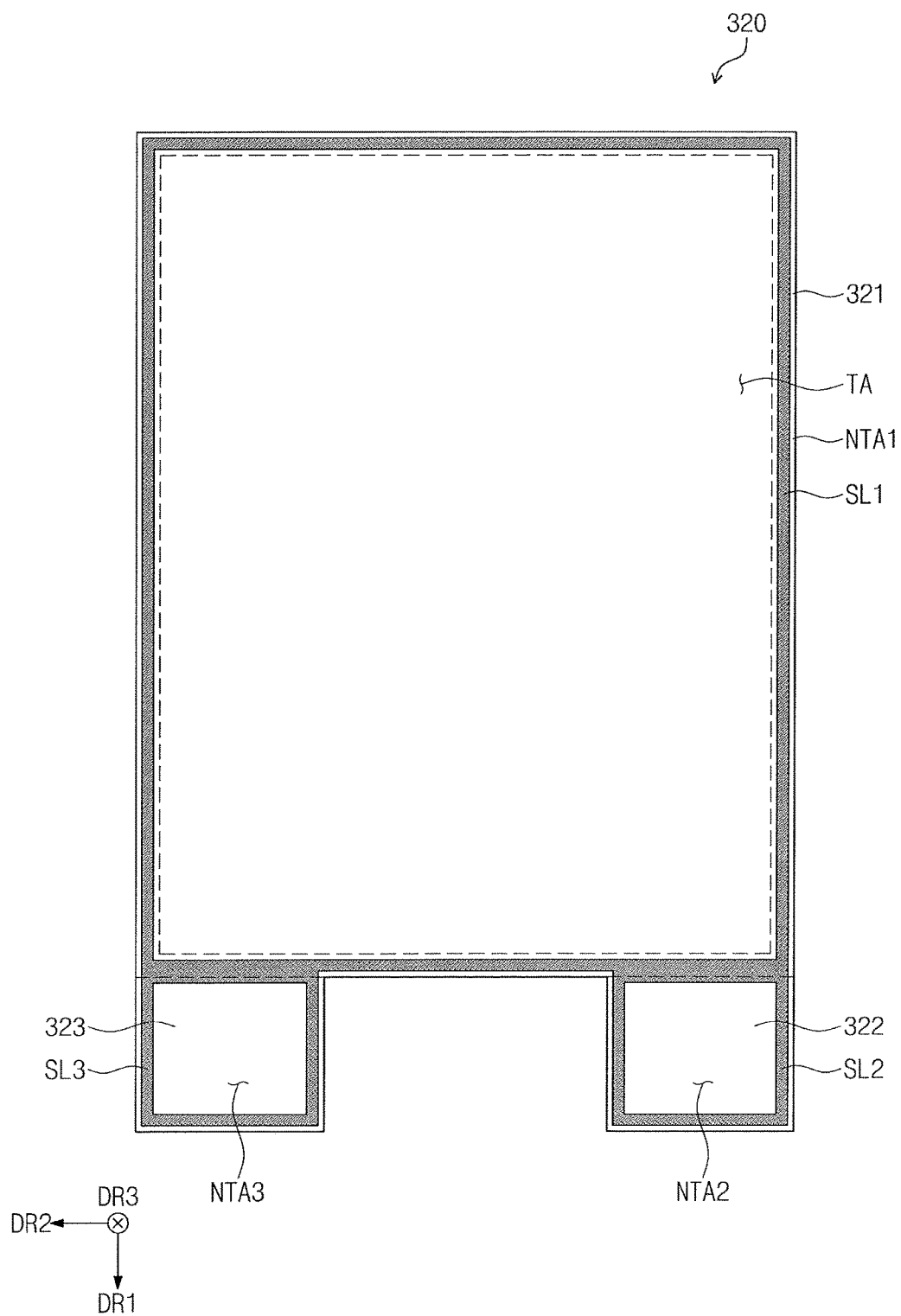
FIG. 7 illustrates a bottom-side view of the touch substrate of FIG. 1.

FIG. 7 is a bottom-side view of the touch substrate 320.

Referring to FIGS. 4 to 7, sealing elements SL1-SL3 may be provided to hermetically seal a space between the display and touch substrates 310 and 320. For example, the sealing elements SL1-SL3 may include glass or polymer. In some embodiments, fit including glass powder may be coated on a bottom surface of the touch substrate 320, and this may make it possible to couple the display and touch substrates 310 and 320 to each other. The sealing elements SL1-SL3 may have a black color. The sealing elements SL1-SL3 may be provided along an edge region of each of the first to third inactive regions NTA1 to NTA3 and on the bottom surface of the touch substrate 320.

In some embodiments, a space between the display and touch substrates 310 and 320, in which the sealing elements SL1-SL3 are not provided, may be a vacuum state. The sealing elements SL1-SL3 may have a thickness ranging from about 3 μm to about 10 μm.

Embodiments are not limited to a specific color of the sealing elements SL1-SL3. For example, in certain embodiments, the sealing elements SL1-SL3 may be formed of or include a colorless transparent material and may be provided to fully cover the bottom surface of the touch substrate 320 or to fill the space between the display and touch substrates 310 and 320.

The sealing elements SL1-SL3 may include first, second, and third sealing elements SL1, SL2, and SL3. The first sealing element SL1 may be coated on a bottom surface of the input sensing unit 321 of the touch substrate 320. For example, the first sealing element SL1 may be provided to be overlapped with the first inactive region NTA1.

The second sealing element SL2 may be coated on a bottom surface of the first extended portion 322 of the touch substrate 320. For example, the second sealing element SL2 may be provided to be overlapped with an edge region of the first extended portion 322.

The third sealing element SL3 may be coated on a bottom surface of the second extended portion 323 of the touch substrate 320. For example, the third sealing element SL3 may be provided to be overlapped with an edge region of the second extended portion 323.

According to some embodiments, the first and second extended portions 322 and 323 of the touch substrate 320 may extend from the input sensing unit 321 in the first direction DR1 and may cover at least a portion of the pad unit PD of the display substrate 310. Accordingly, a contact area between the display and touch substrates 310 and 320 may be increased, e.g., as compared to a contact area between substrates having no extended portions, and this may make it possible to increase hardness of the display panel 300. According to some embodiments, the first and second extended portions 322 and 323 of the touch substrate 320 may cover a portion of the pad unit PD and thus may protect interconnection lines formed in the pad unit PD. Accordingly, it may be possible to improve durability of the display panel 300.

Figure 8:
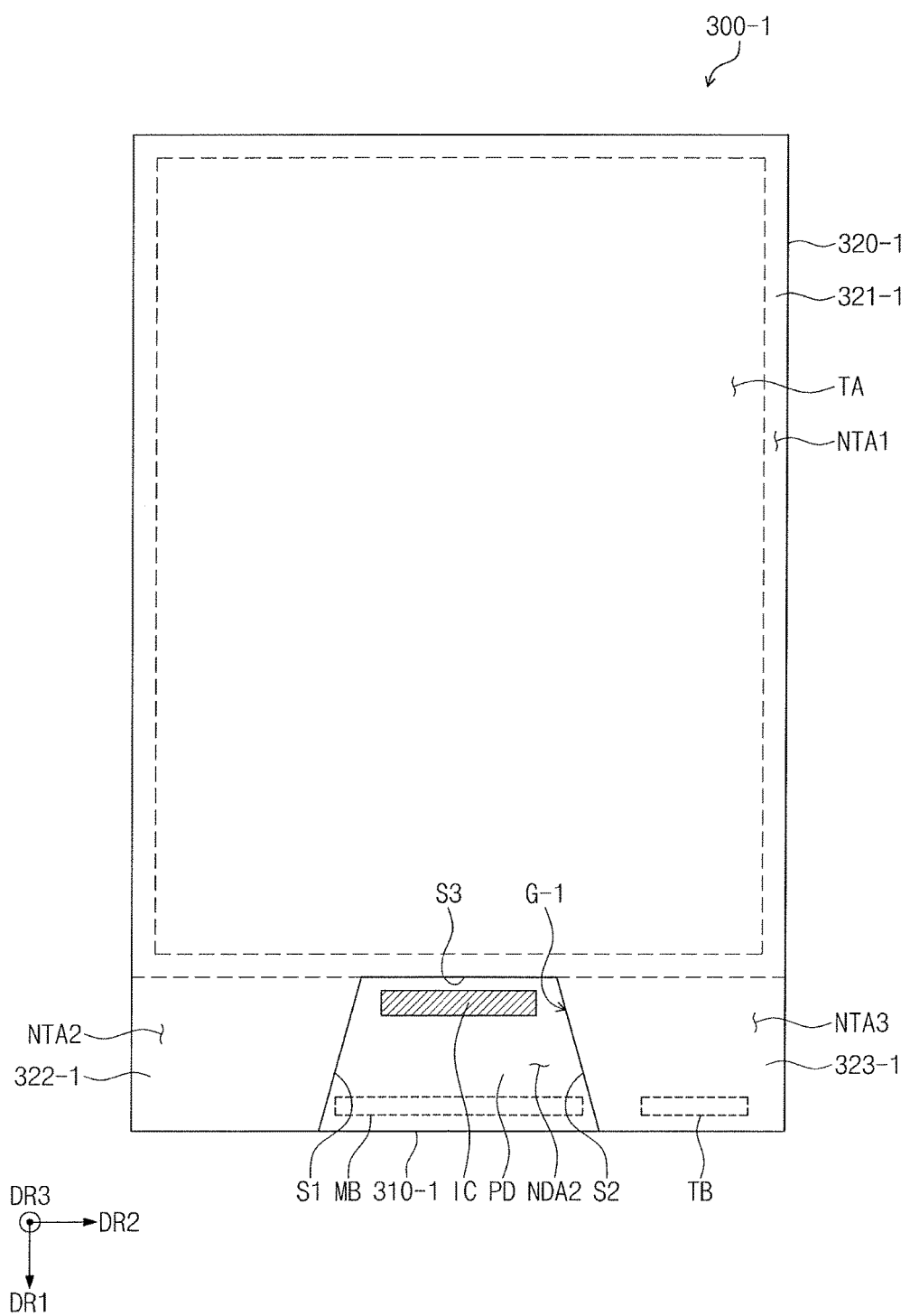
FIG. 8 illustrates a top-side view of a display panel according to other embodiments.

FIG. 8 is a top-side view of a display panel according to other embodiments. In the following description of FIG. 8, a previously described element may be identified by a similar or identical reference number without repeating an overlapping description thereof, for the sake of brevity.

According to other embodiments, as shown in FIG. 8, a portion of the pad unit PD exposed by a groove G-1 of a touch substrate 320-1 may have a trapezoid shape, when viewed in a plan view. As an example, a distance between the first surface S1 and the second surface S2 may increase with increasing distance from the third surface S3. In such an embodiment, a contact area between a display substrate 310-1 and the touch substrate 320-1 may be further increased.

Figure 9:
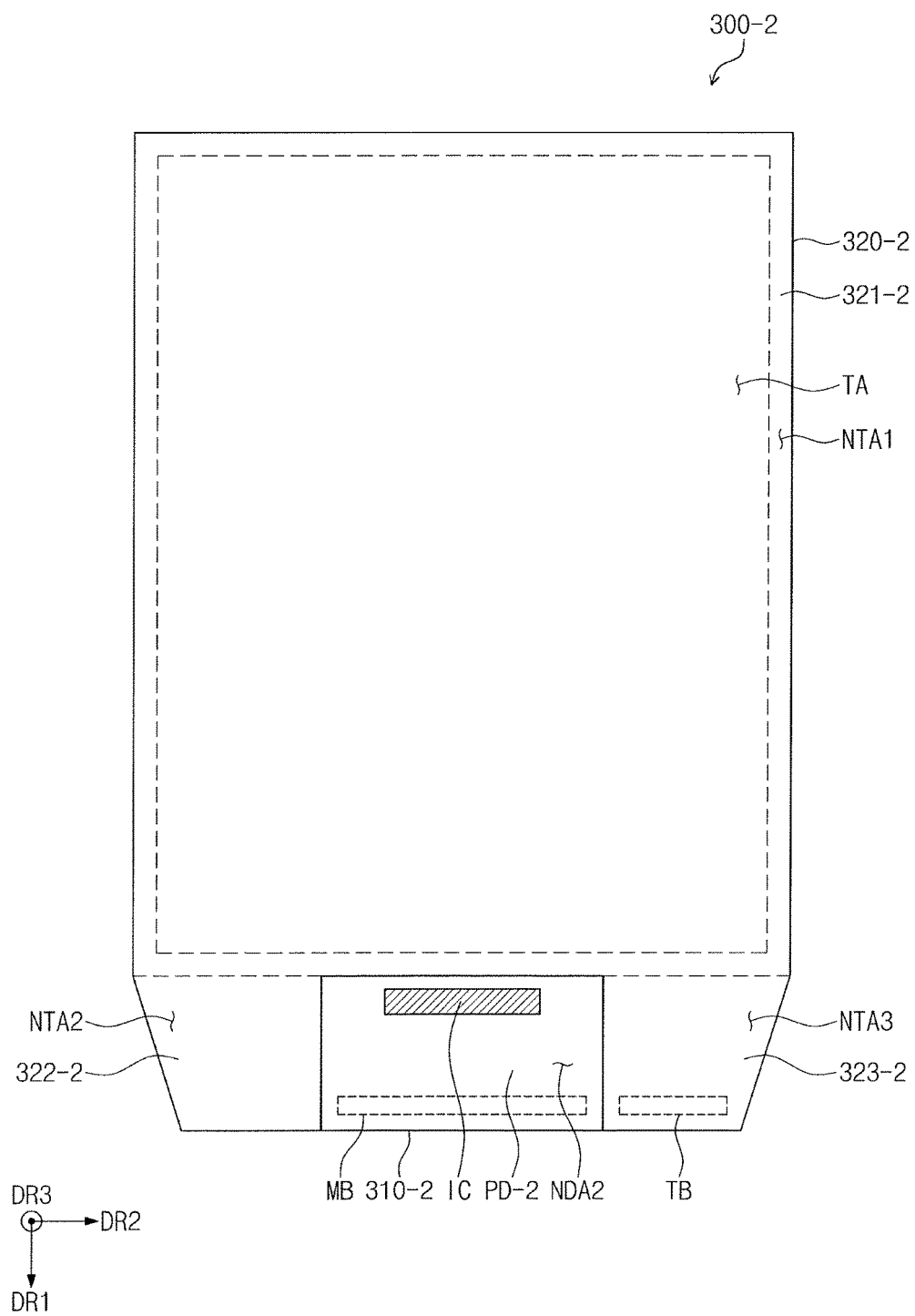
FIG. 9 illustrates a top-side view of a display panel according to other embodiments.

FIG. 9 is a top-side view of a display panel according to other embodiments. In the following description of FIG. 9, a previously described element may be identified by a similar or identical reference number without repeating an overlapping description thereof, for the sake of brevity.

According to other embodiments, as shown in FIG. 9, a pad unit PD-2 may have a trapezoid shape whose width decreases with increasing distance from an input sensing unit 321-2. For example, a length, in the second direction DR2, of the pad unit PD-2 may decreases with increasing distance from the display region DA and the first non-display region NDA1.

A first extended portion 322-2 and a second extended portion 323-2 may have a shape corresponding to that of the pad unit PD-2. For example, a length, in the second direction DR2, of each of the first and second extended portions 322-2 and 323-2 may decreases with increasing distance from the input sensing unit 321-2. Here, a distance between the first and second extended portions 322-2 and 323-2 may not be changed. In such an embodiment, it may be possible to reduce an area of a weak portion of the display panel 300.

Figure 10A:
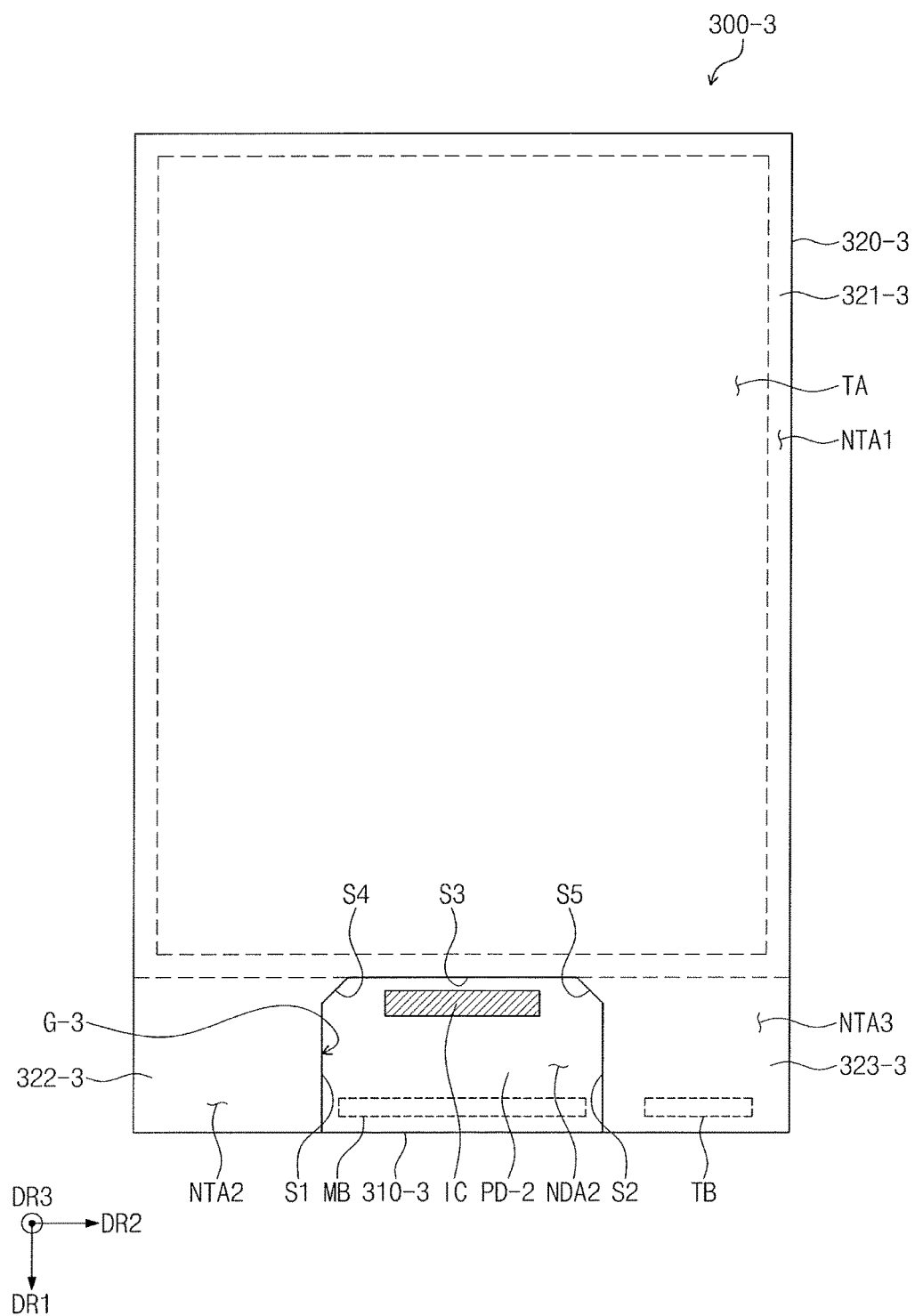
FIG. 10A illustrates a top-side view of a display panel according to other embodiments.
Figure 10B:
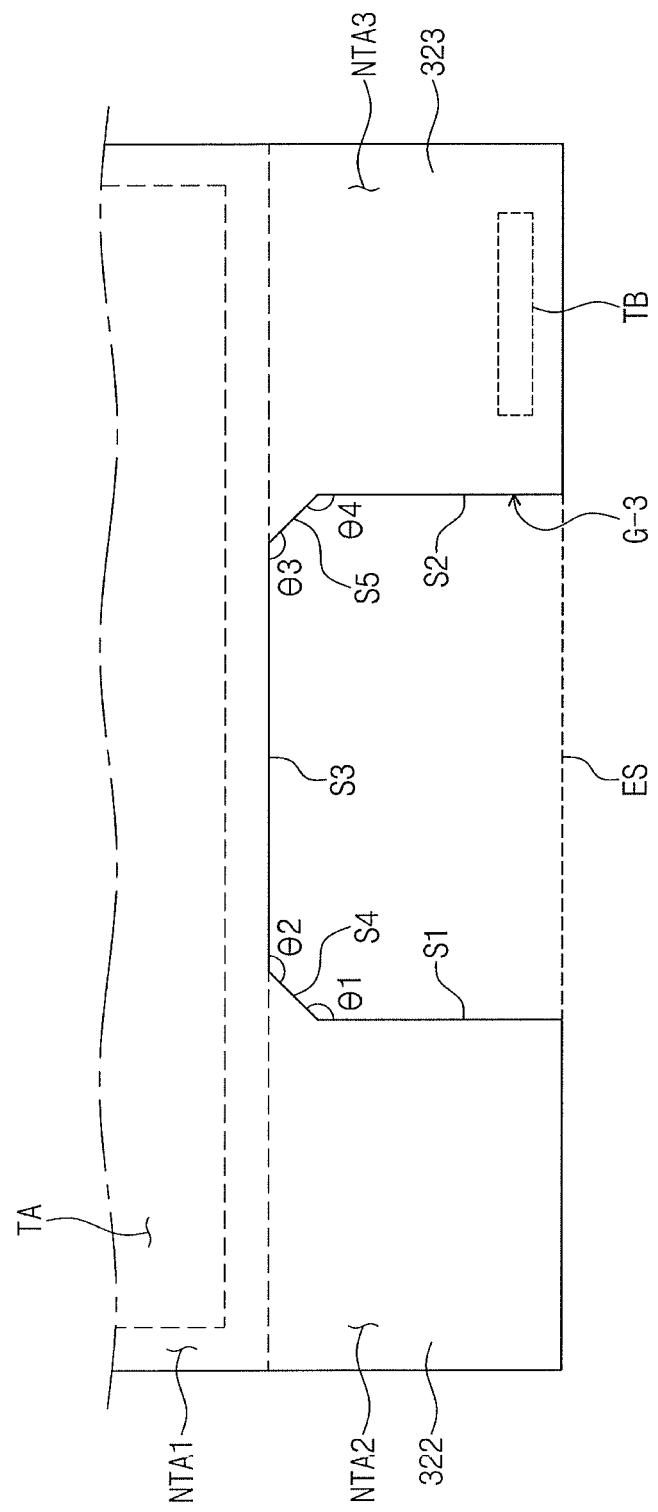
FIG. 10B illustrates an enlarged view of the groove of FIG. 10A.

FIG. 10A is a top-side view of a display panel according to other embodiments. FIG. 10B is an enlarged view of the groove of FIG. 10A. In the following description of FIGS. 10A and 10B, a previously described element may be identified by a similar or identical reference number without repeating an overlapping description thereof, for the sake of brevity.

According to other embodiments, as shown in FIGS. 10A and 10B, an inner surface of a groove G-3 of a touch substrate 320-3 may further include a fourth surface S4 and a fifth surface S5.

The fourth surface S4 may be defined as one of inner side surfaces of a first extended portion 322-3 extending from the first surface S1. The fourth surface S4 may connect the first surface S1 to the third surface S3. The fourth surface S4 may be provided to have an obtuse angle relative to each of the first and third surfaces S1 and S3.

The fourth surface S4 may be defined as one of inner side surfaces of the second extended portion 323-3 extending from the second surface S2. The fifth surface S5 may connect the second surface S2 to the third surface S3. The fifth surface S5 may be provided to have an obtuse angle relative to each of the second and third surfaces S2 and S3.

For example, the first surface S1 may be provided to have a first angle θ1 relative to the fourth surface S4. The fourth surface S4 may be provided to have a second angle θ2 relative to the third surface S3. The third surface S3 may be provided to have a third angle θ3 relative to the fifth surface S5. The fifth surface S5 may be provided to have a fourth angle θ4 relative to the second surface S2.

Each of the first to fourth angles θ1-θ4 may be one of internal angles of a closed curve which is defined by an extension surface ES, which is an imaginary surface connecting a side surface of the first extended portion 322-3 to a side surface of the second extended portion 323-3, and the first to fifth surfaces S1-S5.

As an example, the first to fourth angles θ1-θ4 may be 135 degrees. However, embodiments are not limited to this angle. For example, the first to fourth angles θ1-θ4 may be obtuse angles, at least one of which is different from the others. In such an embodiment, a contact area between a display substrate 310-3 and the touch substrate 320-3 may be increased.

Figure 11:
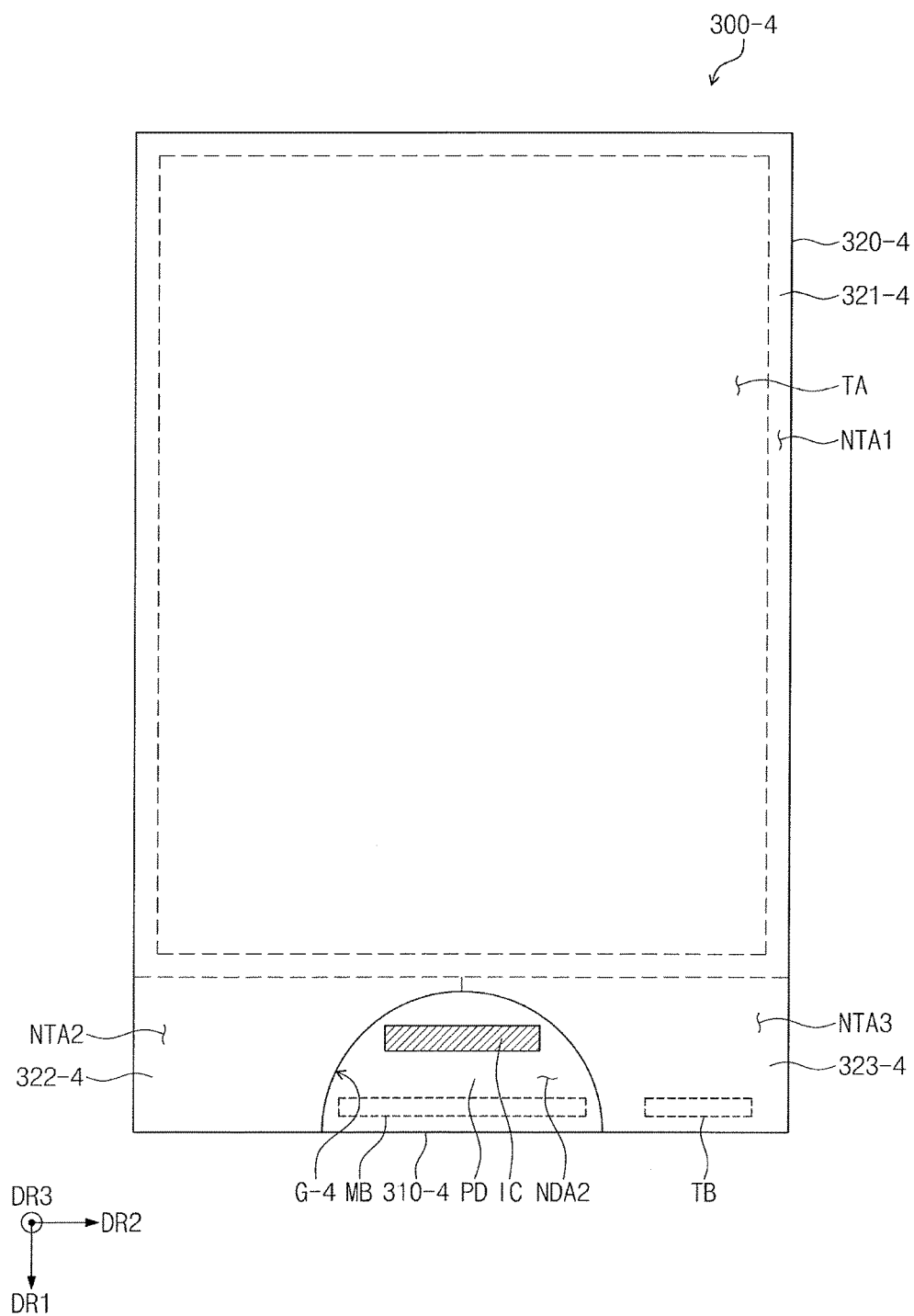
FIG. 11 illustrates a top-side view of a display panel according to other embodiments.

FIG. 11 is a top-side view of a display panel according to other embodiments. In the following description of FIG. 11, a previously described element may be identified by a similar or identical reference number without repeating an overlapping description thereof, for the sake of brevity.

According to other embodiments, as shown in FIG. 11, a groove G-4 of a touch substrate 320-4 may include at least one curved surface. For example, the groove G-4 may have a semi-circular shape, when viewed in a plan view. However, embodiments are not limited to this example. For example, in certain embodiments, at least one of the first to fifth surfaces S1 to S5 shown in FIGS. 10A and 10B may include a curved surface. In such an embodiment, a contact area between a display substrate 310-4 and the touch substrate 320-4 may be increased.

Figure 12:
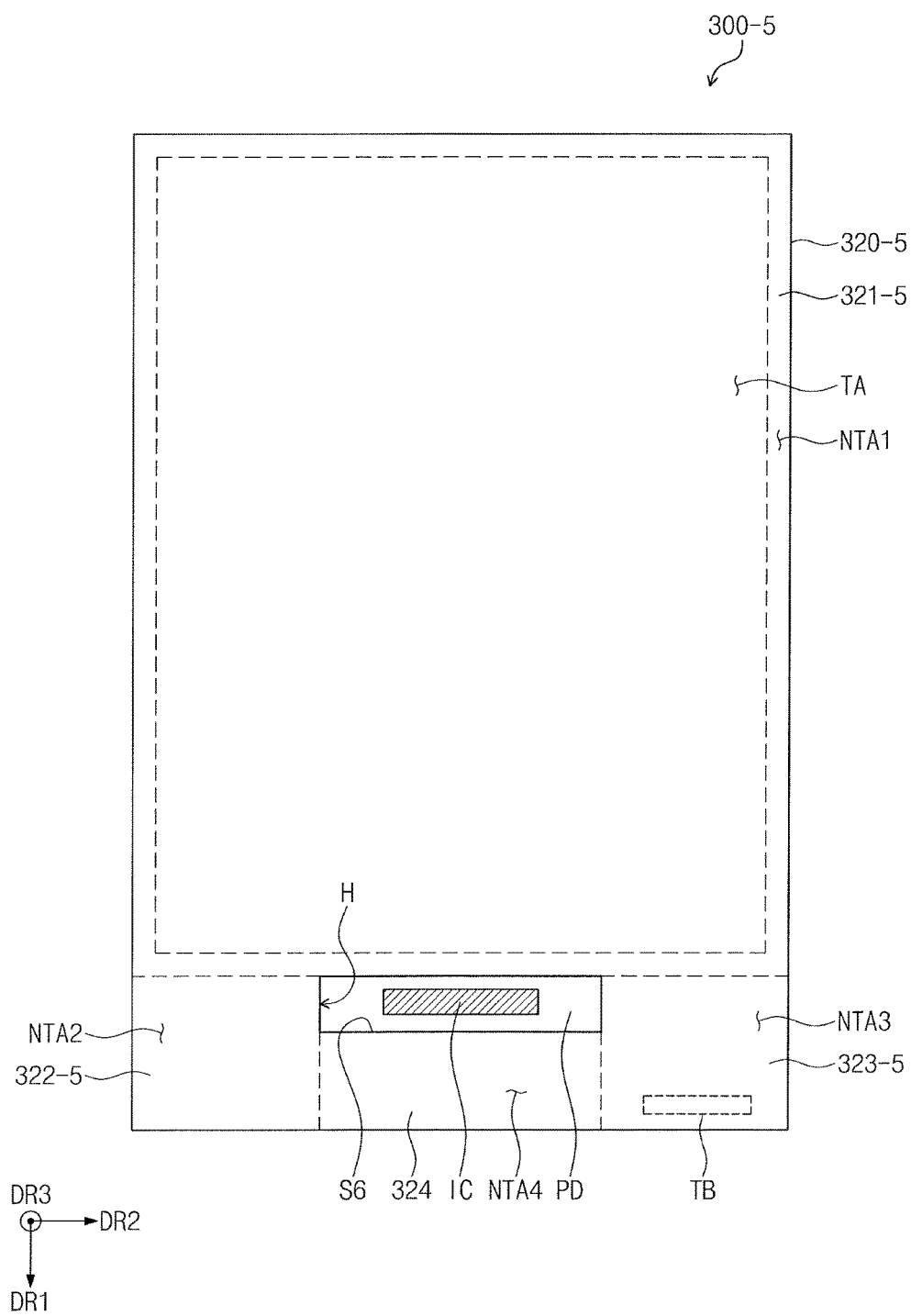
FIG. 12 illustrates a top-side view of a display panel according to other embodiments.

FIG. 12 is a top-side view of a display panel according to other embodiments. In the following description of FIG. 12, a previously described element may be identified by a similar or identical reference number without repeating an overlapping description thereof, for the sake of brevity.

According to other embodiments, as shown in FIG. 12, a touch substrate 320-5 may further include a third extended portion 324. The third extended portion 324 may be provided between first and second extended portions 322-5 and 323-5. The third extended portion 324 may be provided in a side region of the touch substrate 320-5 in the first direction DR1. The third extended portion 324 may be spaced apart from the input sensing unit 321-5.

The input sensing unit 321-5, the first extended portion 322-5, the second extended portion 323-5, and the third extended portion 324 may be provided to define a hole H in a side region of the touch substrate 320-5 in the first direction DR1. The hole H may be defined by an inner side surface of each of the input sensing unit 321-5, the first extended portion 322-5, the second extended portion 323-5, and the third extended portion 324.

For example, the hole H may include a sixth surface S6, in addition to the first surface S1, the second surface S2, and the third surface S3. The first surface S1 may be defined as an inner side surface of the first extended portion 322-5. The second surface S2 may be defined as an inner side surface of the input sensing unit 321-5. The third surface S3 may be defined as an inner side surface of the second extended portion 323-5. The sixth surface S6 may be defined as an inner side surface of the third extended portion 324.

The first surface S1 may face the second surface S2. The first surface S1 may be parallel to the second surface S2. The third surface S3 may face the sixth surface S6. The third surface S3 may be parallel to the sixth surface S6. Each of the first, second, third, and sixth surfaces S1, S2, S3, and S6 may be provided to form a right angle relative to a surface adjacent thereto. In other words, the hole H may have a rectangular or square shape. However, the shape of the hole H is not limited to the rectangular or square shape, e.g., the hole H may have a polygonal, a circular, or an elliptical shape.

The hole H of the touch substrate 320-5 may be provided to at least partially expose the pad unit PD of a display substrate 310-5. As an example, the hole H may be provided to expose a center region of the pad unit PD in the second direction DR2. The driving chip IC may be provided on the exposed region of the pad unit PD. In this case, although not shown, the first bonding part MB in the previous embodiments may be covered with the touch substrate 320-5 and may be prevented from being exposed to the outside. In the case where the first bonding part MB is provided in a space between the touch and display substrates 320-5 and 310-5, the sealing elements SL1-SL3 may have a thickness that is greater than or equal to that of the first flexible circuit board 10.

Various types of display panels have been described. However, embodiments are not limited to a specific type of the display panel 300, and various other types of display panels may be used to realize embodiments.

Figure 13A:
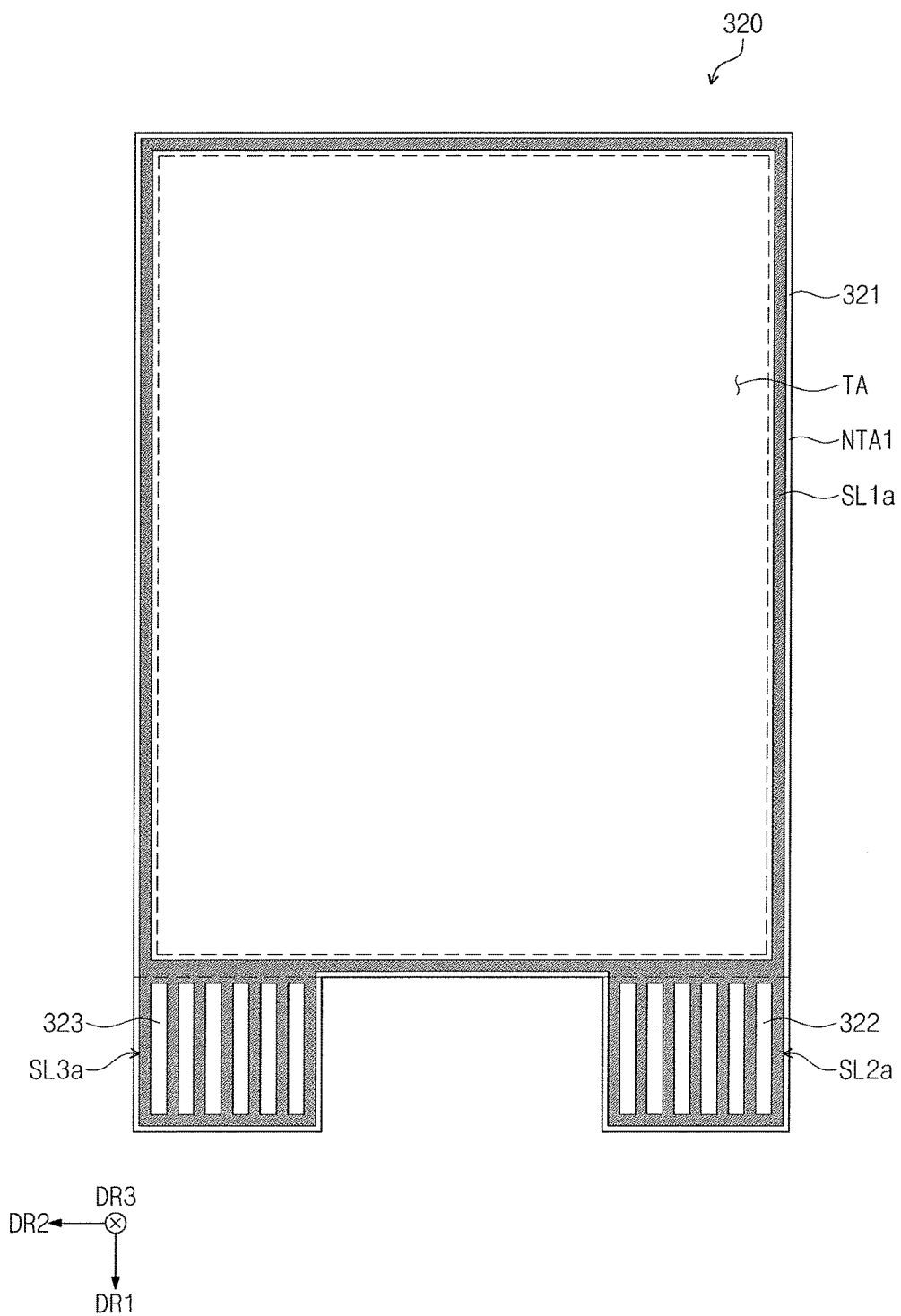
FIG. 13A illustrates a bottom-side view of a touch substrate according to other embodiments.
Figure 13B:
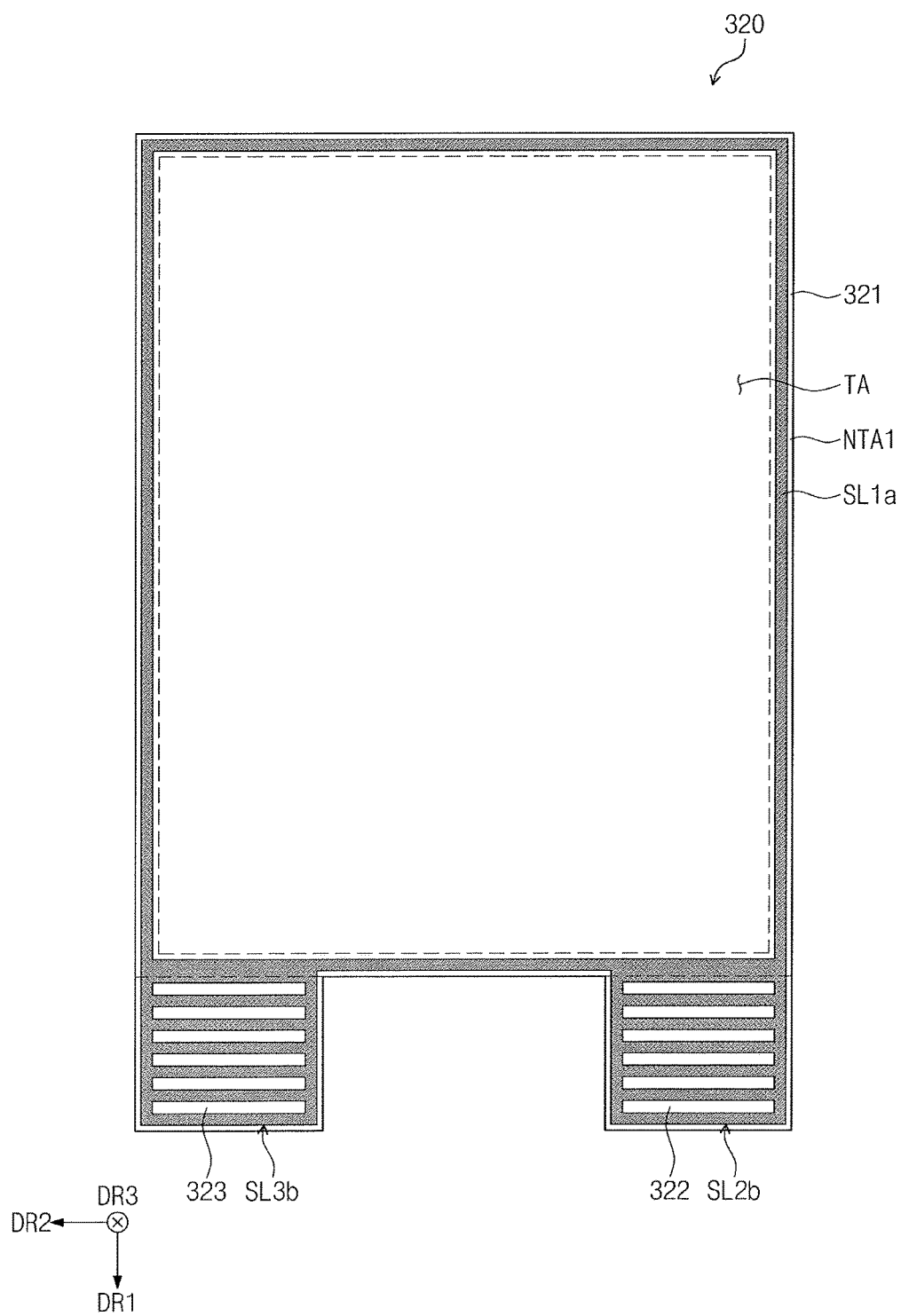
FIG. 13B illustrates a bottom-side view of a touch substrate according to other embodiments.

FIGS. 13A and 13B are bottom-side views of touch substrates according to other embodiments. In the following description of FIGS. 13A and 13B, a previously described element may be identified by a similar or identical reference number without repeating an overlapping description thereof, for the sake of brevity.

Referring to FIG. 13A, sealing elements SL1a, SL2a, and SL3a may be coated on the touch substrate 320. The first sealing element SL1a may be provided on the bottom surface of the input sensing unit 321 of the touch substrate 320 to be overlapped with the first inactive region NTA1.

The second sealing element SL2a may be provided on the bottom surface of the first extended portion 322 of the touch substrate 320 and may be overlapped with an edge region of the first extended portion 322. The third sealing element SL3a may be provided on the bottom surface of the second extended portion 323 of the touch substrate 320 to be overlapped with an edge region of the second extended portion 323.

The second and third sealing elements SL2a and SL3a may form a patterned structure. For example, the second and third sealing elements SL2a and SL3a may be provided on the bottom surfaces of the first and second extended portions 322 and 323 to extend in the first direction DR1 and may be arranged in the second direction DR2.

Referring to FIG. 13B, second and third sealing elements SL2b and SL3b may be provided on the bottom surfaces of the first and second extended portions 322 and 323 to extend in the second direction DR2 and may be arranged in the first direction DR1 to form a patterned structure.

In such embodiments, a contact area between the display and touch substrates 310 and 320 may be increased. Therefore, durability of the display panel may be improved.

Figure 14A:
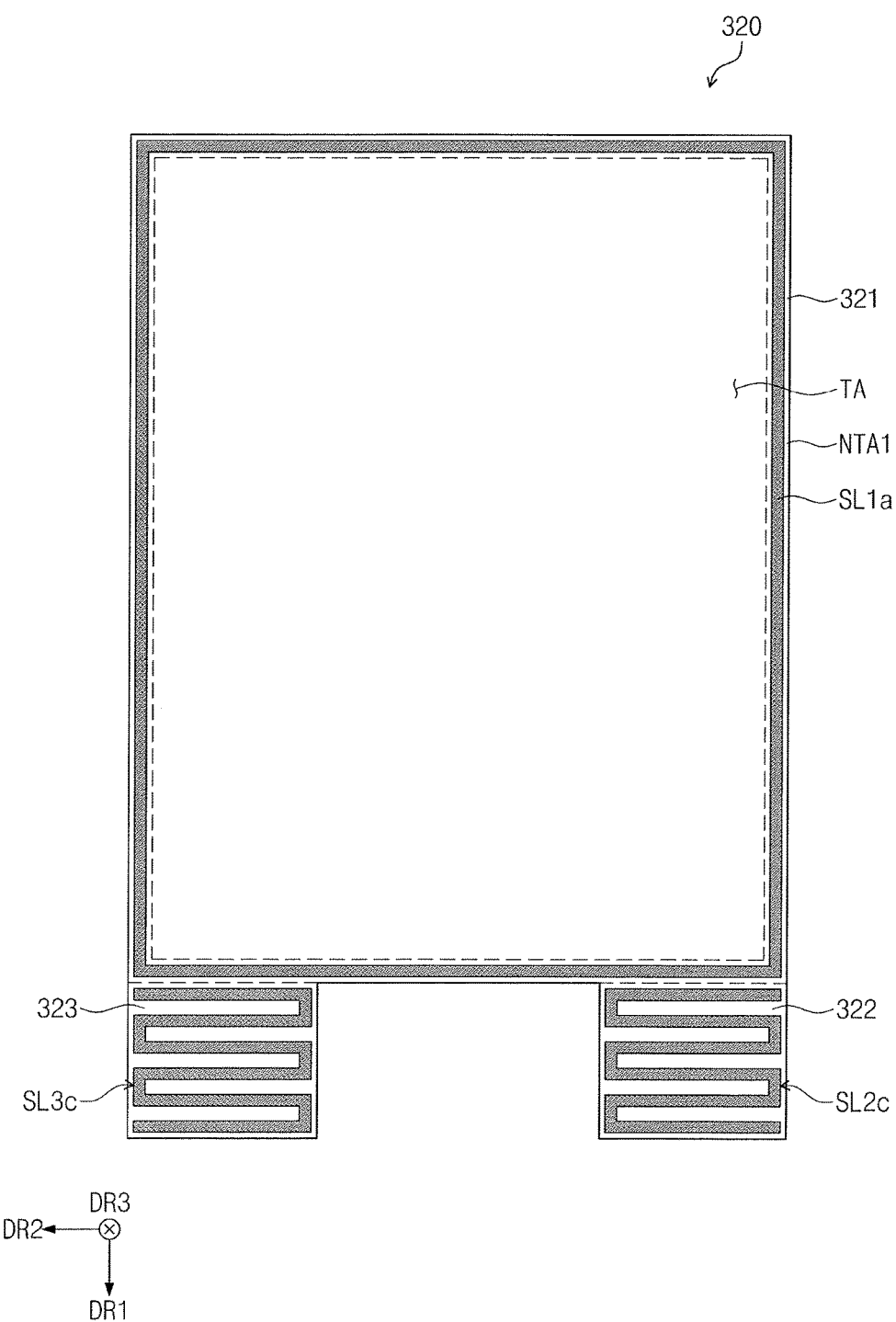
FIG. 14A illustrates a bottom-side view of a touch substrate according to other embodiments.
Figure 14B:
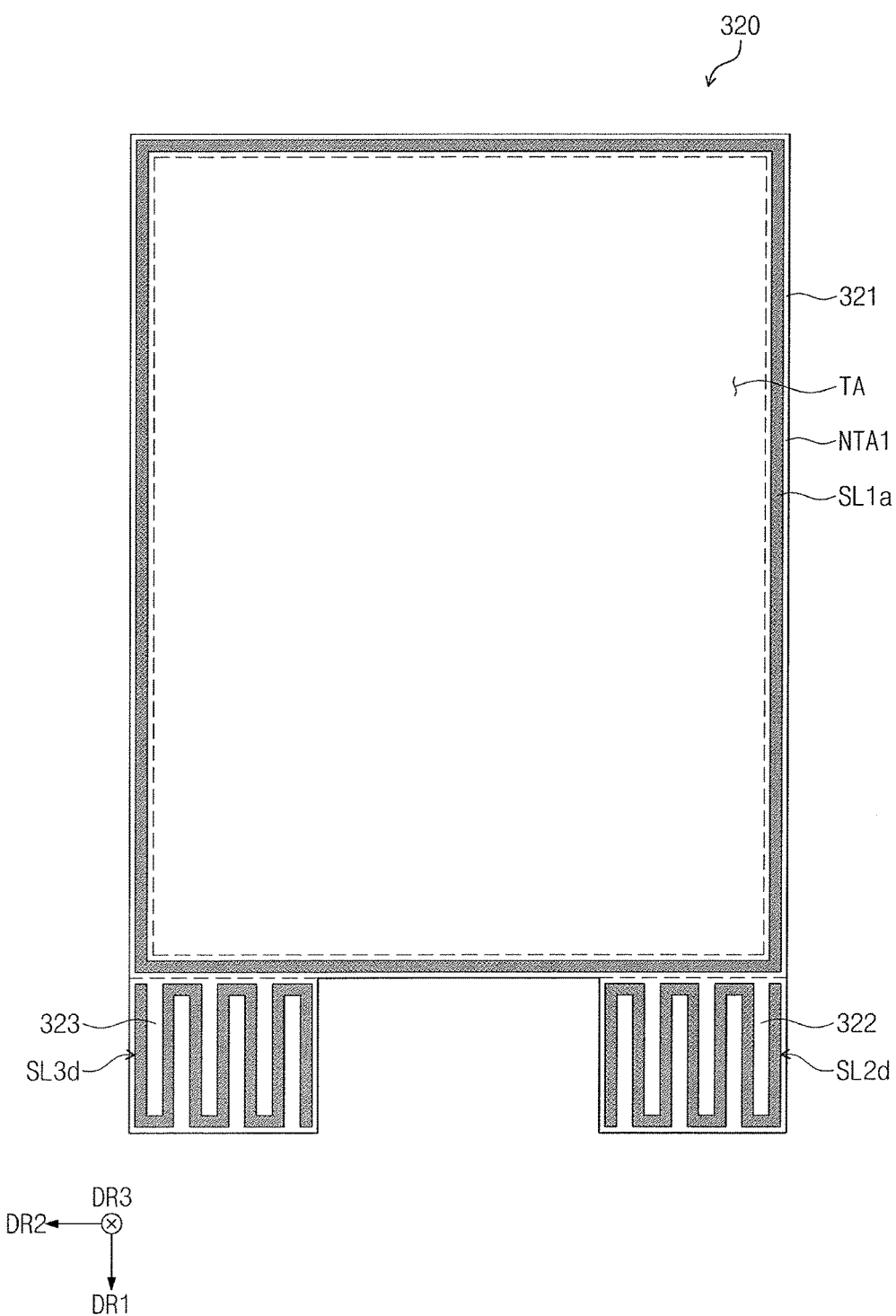
FIG. 14B illustrates a bottom-side view of a touch substrate according to other embodiments.

FIGS. 14A and 14B are bottom-side views of touch substrates according to other embodiments. In the following description of FIGS. 14A and 14B, a previously described element may be identified by a similar or identical reference number without repeating an overlapping description thereof, for the sake of brevity.

Referring to FIG. 14A, a second sealing element SL2c and a third sealing element SL3c may be provided to form a patterned structure. The second and third sealing elements SL2c and SL3c may be provided to have a zigzag shape, on bottom surfaces of the first and second extended portions 322 and 323. For example, each of the second and third sealing elements SL2c and SL3c may include long portions, which are parallel to the second direction DR2, and short portions, which are parallel to the first direction DR1 and are provided to connect the long portions to each other.

Referring to FIG. 14B, a second sealing element SL2d and a third sealing element SL3d may be provided to have a zigzag shape, on bottom surfaces of the first and second extended portions 322 and 323. For example, each of the second and third sealing elements SL2d and SL3d may include long portions, which are parallel to the first direction DR1, and short portions, which are parallel to the second direction DR2 and are provided to connect the long portions to each other.

According to this embodiment, a contact area between the display and touch substrates 310 and 320 may be increased, and this may make it possible to improve durability of the display panel. In addition, embodiments are not limited to a specific structure of the sealing elements, and various other structures of the sealing elements may be used to realize embodiments.

By way of summation and review, according to embodiments, it is possible to improve mechanical properties (e.g., hardness and durability) of a display panel. That is, portions of the touch substrate extend from the input sensing unit to cover at least a portion of the pad unit on the display substrate to increase a contact area between the display and touch substrates, thereby increasing hardness of the display panel while protecting interconnection lines on the pad area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
    a display substrate including a display region and a non-display region surrounding the display region, a pad unit being positioned on a side region of the non-display region; and
    a touch substrate on the display substrate and bonded to the display substrate, the touch substrate including:
        an input sensing unit overlapping the display region of the display substrate,
        a first extended portion extending from a side portion of the input sensing unit and overlapping the pad unit of the display substrate, and
        a second extended portion extending from a side portion of the input sensing unit and overlapping the pad unit of the display substrate, the second extended portion being spaced apart from the first extended portion,
        wherein a bottom surface of the touch substrate faces the display substrate, an entirety of the bottom surface of the touch substrate being coplanar, and bottoms of the first and second extended portions being sections of the bottom surface of the touch substrate, and
        wherein a portion of the pad unit is exposed between the first and second extended portions.

2. The display panel as claimed in claim 1, wherein the first extended portion, the second extended portion, and the input sensing unit are arranged to define a groove through the touch substrate in a side region of the touch substrate, the portion of the pad unit being exposed between the first and second extended portions through the groove.

3. The display panel as claimed in claim 2, wherein an inner surface of the groove includes:
    a first surface defined as one of inner side surfaces of the first extended portion;
    a second surface defined as one of inner side surfaces of the second extended portion, the second surface facing the first surface; and
    a third surface defined as one of inner side surfaces of the input sensing unit, the third surface connecting the first and second surfaces to each other.

4. The display panel as claimed in claim 3, wherein a distance between the first and second surfaces increases with increasing distance from the third surface.

5. The display panel as claimed in claim 3, wherein the inner surface of the groove further includes:
a fourth surface between the first and third surfaces, the fourth surface connecting the first and third surfaces to each other and having an obtuse angle relative to each of the first and third surfaces; and
a fifth surface between the second and third surfaces, the fifth surface connecting the second and third surfaces to each other and having an obtuse angle relative to each of the second and third surfaces.

6. The display panel as claimed in claim 2, wherein an inner surface of the groove includes a curved surface.

7. The display panel as claimed in claim 1, further comprising:
a sealing element on the touch substrate and overlapping the non-display region, the sealing element coupling the display and touch substrates to each other,
wherein the sealing element includes:
a first sealing element overlapping an edge region of the input sensing unit,
a second sealing element overlapping the first extended portion, and
a third sealing element overlapping the second extended portion.

8. The display panel as claimed in claim 7, wherein the sealing element includes glass powder.

9. The display panel as claimed in claim 7, wherein the second sealing element overlaps an edge region of the first extended portion, and the third sealing element overlaps an edge region of the second extended portion.

10. The display panel as claimed in claim 7, wherein each of the second and third sealing elements has a patterned shape.

11. The display panel as claimed in claim 1, wherein:
the touch substrate further includes a third extended portion between the first and second extended portions and spaced apart from the input sensing unit, and
the input sensing unit, the first extended portion, the second extended portion, and the third extended portion define a hole in a side region of the touch substrate, the hole exposing a portion of the pad unit.

12. The display panel as claimed in claim 1, wherein a portion of the display substrate overlapping the pad unit has a width decreasing with increasing distance from the display region.

13. The display panel as claimed in claim 1, wherein:
the first and second extended portions extend from a side surface of the input sensing unit and overlap the pad unit of the display substrate, the side surface of the input sensing unit being perpendicular to the bottom surface of the touch substrate, and
a driving integrated circuit is on the portion of the pad unit exposed between the first and second extended portions, the driving integrated circuit facing the side surface of the input sensing unit.

14. The display panel as claimed in claim 1, wherein the touch substrate is a single substrate continuously overlapping the display region, the non-display region, and part of the pad unit of the display substrate.

15. A display device, comprising:
a window part;
a display panel to display an image;
a polarizing plate between the window part and the display panel, the display panel including:
a display substrate including a display region and a non-display region surrounding the display region, a pad unit being positioned on a side region of the non-display region, and
a touch substrate on the display substrate and bonded to the display substrate, the touch substrate including:
an input sensing unit overlapping the display region of the display substrate,
a first extended portion overlapping the pad unit of the display substrate and connected to a side portion of the input sensing unit, and
a second extended portion overlapping the pad unit of the display substrate, connected to the side portion of the input sensing unit, and spaced apart from the first extended portion,
wherein a bottom surface of the touch substrate faces the display substrate, an entirety of the bottom surface of the touch substrate being coplanar, and bottoms of the first and second extended portions being sections of the coplanar bottom surface of the touch substrate, and
wherein a portion of the pad unit is exposed between the first and second extended portions.

16. The display device as claimed in claim 15, further comprising a printed circuit board below the display panel and electrically connected to the display panel.

17. The display device as claimed in claim 16, further comprising:
a first flexible circuit board electrically connecting the display substrate to the printed circuit board; and
a second flexible circuit board electrically connecting the touch substrate to the printed circuit board.

18. The display device as claimed in claim 17, wherein the display panel further includes:
a first bonding part on the pad unit and connected to the first flexible circuit board; and
a second bonding part in at least one of the first or second extended portion to be connected to the second flexible circuit board.

19. The display device as claimed in claim 17, further comprising a driving integrated circuit on the portion of the pad unit exposed between the first and second extended portions.

20. A display panel, comprising:
a display substrate including a display region and a non-display region surrounding the display region, a pad unit being positioned on a side region of the non-display region; and
a touch substrate on the display substrate and bonded to the display substrate, an entirety of a bottom surface of the touch substrate that faces the display substrate being coplanar, and the touch substrate having a groove through an entire thickness thereof in a side region thereof that overlaps the pad unit,
wherein the pad unit is exposed through the groove.

* * * * *